(12) United States Patent
Andoh

(10) Patent No.: US 6,773,966 B2
(45) Date of Patent: Aug. 10, 2004

(54) METHOD OF MANUFACTURING SEMICONDUCTOR DEVICE

(75) Inventor: Seiji Andoh, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 10 days.

(21) Appl. No.: 10/259,443

(22) Filed: Sep. 30, 2002

(65) Prior Publication Data

US 2003/0178709 A1 Sep. 25, 2003

(30) Foreign Application Priority Data

Mar. 25, 2002 (JP) ........................................ 2002-083366

(51) Int. Cl.⁷ ............................................... H01L 21/44
(52) U.S. Cl. ...................................... 438/126; 438/127
(58) Field of Search ................................. 438/124, 126, 438/127

(56) References Cited

U.S. PATENT DOCUMENTS

| | | | | |
|---|---|---|---|---|
| 5,122,858 A | * | 6/1992 | Mahulikar et al. | 257/753 |
| 5,285,076 A | * | 2/1994 | Kusuda et al. | 250/551 |
| 5,780,924 A | * | 7/1998 | McCormick | 257/667 |
| 5,936,310 A | * | 8/1999 | Wensel | 257/787 |
| 6,083,768 A | * | 7/2000 | Jiang et al. | 438/25 |
| 6,312,551 B1 | * | 11/2001 | Murayama et al. | 156/295 |
| 6,359,335 B1 | * | 3/2002 | Distefano et al. | 257/707 |
| 6,399,004 B1 | * | 6/2002 | Slager | 264/254 |
| 6,569,709 B2 | * | 5/2003 | Derderian | 438/109 |
| 2001/0055866 A1 | * | 12/2001 | Smith et al. | 438/584 |

FOREIGN PATENT DOCUMENTS

JP 2000-31339 1/2000

* cited by examiner

Primary Examiner—David A. Zarneke
(74) Attorney, Agent, or Firm—Rabin & Berdo, P.C.

(57) ABSTRACT

A semiconductor device manufacturing method according to the present invention comprising: arranging a dam made of a highly heat-shrinkable material on a surface of a circuit substrate, wherein the dam defines a region including a semiconductor element, a conductor, and part of a conductive pattern connected to one end of the conductor; injecting a sealer into a region defined by the dam and using the sealer to seal the semiconductor element, the conductor, and part of the conductive pattern connecting with one end of the conductor; and cooling the dam to remove it. Namely, the method can decrease costs, shorten the manufacturing time, and provide miniaturized COB-mounted semiconductor devices.

27 Claims, 3 Drawing Sheets

METHOD OF MANUFACTURING SEMICONDUCTOR DEVICE

BACKGROUND OF THE INVENTION

The present invention relates to a method of manufacturing a semiconductor device and a semiconductor module. More particularly, the present invention relates to a method of manufacturing a semiconductor device allowing a semiconductor chip to be directly mounted on a circuit substrate having conductive patterns etc. formed on its surface and manufacturing a semiconductor module using such semiconductor device.

In recent years, there is an increasing need for miniaturization, light weight, and low profile of devices in the field of electronic devices. In addition, there is also an increasing need for miniaturization, light weight, and low profile of a semiconductor device as a component of these electronic devices.

For satisfying these demands, a technology called COB (Chip On Board) is presently put into practical use as one of technologies to mount semiconductor devices. The COB technology directly mounts a semiconductor chip on the circuit substrate where conductive patterns and the like are formed.

The following describes a COB package using the conventional COB mounting technology.

A conventional package comprises a circuit substrate where a conductive pattern is formed on its surface; a semiconductor chip arranged on the circuit substrate; a wire as a conductor to electrically connect an electrode of the semiconductor chip with the conductive pattern on a surface of the circuit substrate; a sealing frame that is provided on the circuit substrate and surrounds a region including a wire, part of the conductive pattern connecting with the wire, and the semiconductor chip; and a sealer comprising such as resin or the like injected in the sealing frame.

The sealing frame provided on the circuit substrate works as a dam for preventing an outflow of the sealer such as resin injected in the frame. This configuration reliably protects the wire, part of the conductive pattern connecting with the wire, and the semiconductor chip all of which need to be protected.

The conventional method of manufacturing COB packages arranges semiconductor chips made of a silicon wafer on the circuit substrate, for example. A known technology such as the wire bonding is used to electrically connects semiconductor chip electrodes and conductive patterns on the circuit substrate with each other.

Then, the sealer such as a sealing resin is used to seal the semiconductor chip, the wire, and part of the conductive pattern connecting with the wire mounted on the circuit substrate. In order to seal the semiconductor chip, the sealing frame defines a region that includes the semiconductor chip, the wire electrically connecting a semiconductor chip with a circuit substrate conductive pattern, and part of the conductive pattern connecting with one end of the wire. This sealing frame is provided at a specified position on the circuit substrate by using known printing and mounting methods. A fluid sealing resin is then injected into the sealing frame.

SUMMARY OF THE INVENTION

However, a COB-mounted semiconductor device according to the conventional manufacturing method provides each semiconductor device with the sealing frame to prevent the sealer from flowing out. The semiconductor chip is sealed by injecting the sealer into the sealing frame. Accordingly, an external dimension of each semiconductor device is restricted by the sealing frame provided on the circuit substrate, bottlenecking the miniaturization of semiconductor devices. In addition, the conventional method provides the sealing frame each time an individual semiconductor device is formed, increasing costs and the manufacturing time.

When a semiconductor module includes the COB-mounted semiconductor device according to the conventional manufacturing method, a sealing frame used for the COB mounting is arranged on a solder resist formed between the COB-mounted semiconductor device and an adjacently mounted semiconductor device. For this reason, a sealing frame width, misalignment of a solder resist mask, etc. affect a length of the solder resist provided between the COB-mounted semiconductor device mounted on the circuit substrate and the adjacently mounted semiconductor device. Consequently, a specified distance is inevitable between the semiconductor devices, making it difficult to miniaturize semiconductor modules.

It is therefore an object of the present invention to provide a method of manufacturing miniaturized COB-mounted semiconductor devices and semiconductor modules by decreasing costs and shortening the manufacturing time.

To solve the above-mentioned problems, a semiconductor device manufacturing method according to the present invention comprising: arranging a dam made of a highly heat-shrinkable material on a circuit substrate having at least one surface provided with a semiconductor element, a conductive pattern, and a conductor having one end connected to the semiconductor element and the other end connected to the conductive pattern, wherein the dam defines a region including the semiconductor element, the conductor, and the part of the conductive pattern connected to the other end of the conductor; injecting a sealer into a region defined by the dam and using the sealer to seal the semiconductor element, the conductor, and the part of the conductive pattern connecting with the other end of the conductor; and cooling the dam to remove it.

Another semiconductor device manufacturing method according to the present invention comprising: arranging a dam made of a highly heat-shrinkable material on a first circuit substrate having at least one first surface provided with a first semiconductor element, a first conductive pattern, and a first conductor having one end connected to the first semiconductor element and the other end connected to the first conductive pattern, wherein the dam defines a region including the first semiconductor element, the first conductor, and the part of the first conductive pattern connected to the other end of the first conductor; injecting a sealer into a region defined by the dam and using the sealer to seal the first semiconductor element, the first conductor, and the part of the first conductive pattern; cooling the dam to remove it; and arranging the removed dam on a second circuit substrate having at least one second surface provided with a second semiconductor element, a second conductive pattern, and a second conductor having one end connected to the second semiconductor element and the other end connected to the second conductive pattern, injecting a sealer into the removed dam arranged on the second circuit substrate, and using the sealer to seal the second semiconductor element, the second conductor, and part of the second conductive pattern connecting with the other end the second conductor.

Yet another semiconductor module manufacturing method comprising: arranging a dam made of a highly heat-shrinkable material on a circuit substrate having at least one surface provided with a semiconductor element, a conductive pattern, and a conductor having one end connected to the semiconductor element and the other end connected to the conductive pattern, wherein the dam defines a region including the semiconductor element, the conductor, and the part of the conductive pattern connected to the other end of the conductor; injecting a sealer into a region defined by the dam and using the sealer to seal the semiconductor element, the conductor, and the part of the conductive pattern; cooling the dam to remove it and forming a first semiconductor device mounted on the circuit substrate; and mounting a second semiconductor device on the circuit substrate, wherein the second semiconductor device is separated from the first semiconductor device for a specified distance.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENT

A first embodiment of the present invention will be described in further detail with reference to the accompanying drawings.

Figure 1A:
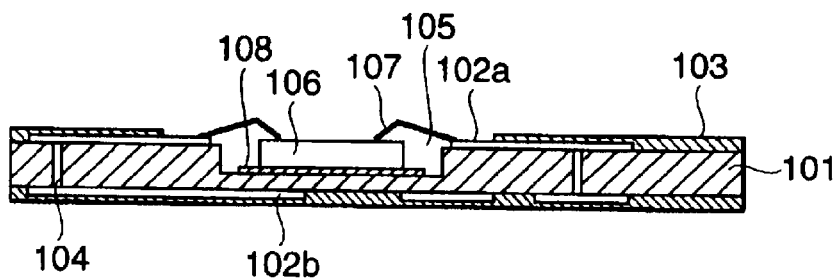
FIGS. 1a–1d are sectional views showing processes in a semiconductor device manufacturing method according to the present invention.
Figure 1B:
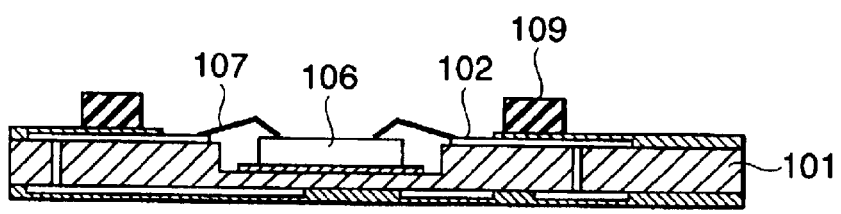
Figure 1C:
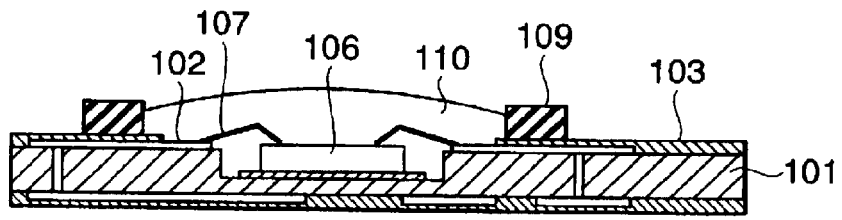
Figure 1D:
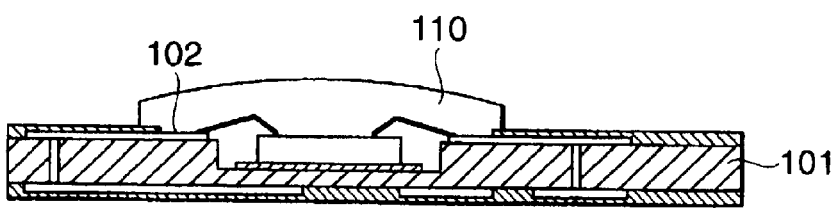
Figure 2A:
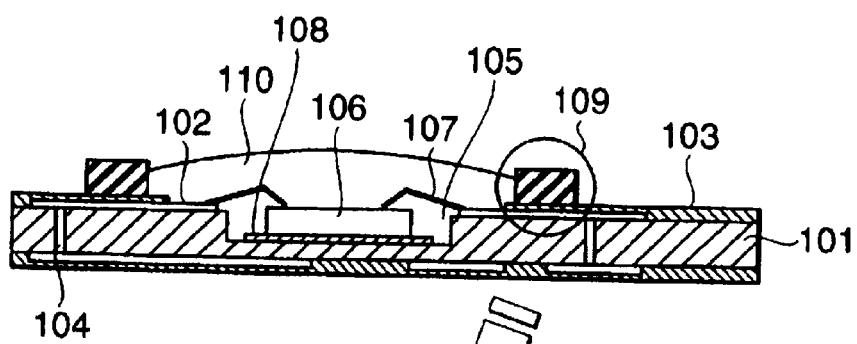
FIGS. 2a and 2b are sectional views showing another configuration example of a sealing frame in the semiconductor device manufacturing method according to the present invention.
Figure 2B:
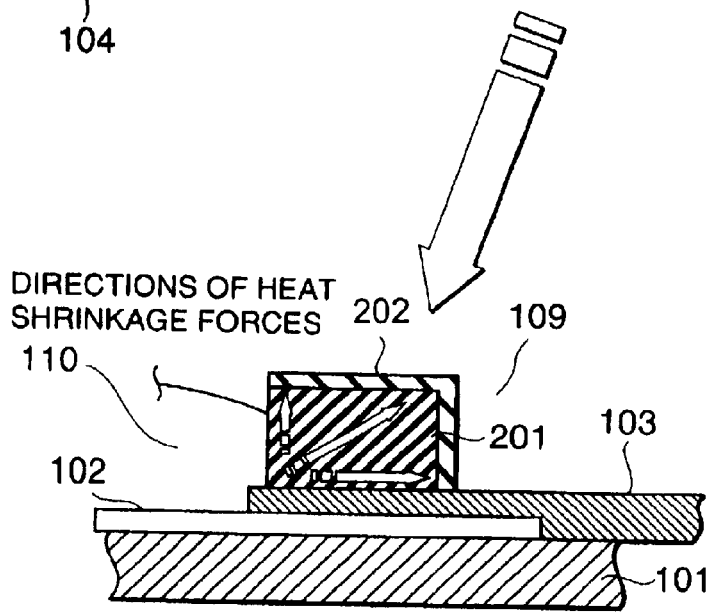

FIGS. 1(a) through 1(d) are sectional views showing processes in the semiconductor device manufacturing method according to the present invention. FIGS. 2(a) and 2(b) are enlarged fragmentary sectional views showing another configuration of a sealing frame according to the present invention. FIG. 2(a) is a semiconductor device as shown in FIG. 1(c). FIG. 2(b) is an enlarged detail of the sealing frame shown in FIG. 2(a).

As shown in FIG. 1(a), a circuit substrate 101 comprising a glass/epoxy resin, etc. is first prepared.

A conductive pattern 102 comprising a conductive film such as copper (Cu) is formed on first and second surfaces of the circuit substrate 101. According to the embodiment, a conductive pattern 102a formed on the first surface of the circuit substrate 101 and a conductive pattern 102b formed on the second surface of the substrate 101 are electrically connected to each other via a through hole 104 formed in the circuit substrate 101.

Part of the conductive pattern 102 on the surface of the circuit substrate 101 is connected with a conductor such as a bonding wire 107 that electrically connects that conductive pattern 102 with an electrode of a semiconductor element 106 mounted on the circuit substrate 101. On another part of the conductive pattern 102, there is formed a solder resist 103 as a conductor protection layer that protects the conductive pattern 102 on the circuit substrate 101.

The circuit substrate 101 according to the embodiment is structured to provide a concave portion 105 on the surface of the circuit substrate 101 where the semiconductor element 106 is to be mounted. The concave portion 105 has a bottom surface lower than the surface of the circuit substrate 101 where the conductive pattern 102 is formed.

The semiconductor device manufacturing method according to the embodiment arranges a fixing member 108 comprising, e.g., silver (Ag) paste, insulating paste, etc. on the bottom surface in the concave portion 105. The fixing member 108 fixes the semiconductor element 106 on the circuit substrate 101.

According to the embodiment using the circuit substrate 101 having the concave portion 105, the semiconductor element 106 is mounted on the bottom surface of the concave portion 105 lower than the surface where the conductive pattern 102 is formed. As a result, it is possible to provide a semiconductor device having a lower profile than the semiconductor device that is formed and mounted on the circuit substrate 101 without the concave portion 105. For example, when the concave portion 105 is formed so as to position its bottom surface approximately 0.15 mm lower than the surface of the circuit substrate 101, it is possible to keep the total thickness of the completed semiconductor device within approximately 0.3 mm measured from the surface of the circuit substrate 101 where the transport 102 is formed.

After the semiconductor element 106 is mounted on the circuit substrate 101 in this manner, a conductor such as the bonding wire 107 made of gold (Au) is used to electrically connect the electrode on the semiconductor element 106 with the conductive pattern 102 on the circuit substrate 101. At this time, a known wire bonding method is used to connect the electrode on the semiconductor element 106 with the conductive pattern 102 on the circuit substrate 101.

A sealing frame 109 is provided on the circuit substrate 101 around a region including the semiconductor element 106, the bonding wire 107, and part of the wire 102 connecting with the bonding wire 107. The sealing frame 109 is used as a dam to prevent outflow of a sealer 110 injected into the frame during a later process. It is desirable to provide the sealing frame 109 so that its inner wall is positioned approximately 0.35 mm away from the end of the bonding wire 107 connected to the conductive pattern 102.

The sealing frame 109 provided on the circuit substrate 101 has the width of approximately 0.4 mm or more and has the height of 0.08 mm or more. The sealing frame 109 needs to be formed of a material having the better heat shrink-ability than for the sealer 110 to be used in the later process.

When the embodiment adopts a known sealing method using epoxy resin, it is possible to use the sealing frame 109 comprising metal such as copper (Cu), aluminum (Al), silver (Ag), etc., or comprising a resin having high viscosity and increased heat shrink-ability such as high-viscosity epoxy resin, polyimide resin, etc.

The embodiment uses a metal mold or the like to prefabricate the sealing frame 109. The sealing frame 109 is fixed to a specified position of the circuit substrate 101. Thus, the Cu sealing frame 109 is provided at a specified position on the circuit substrate 101.

There are other methods of forming the sealing frame 109. One example is the publicly known screen printing method. This method provides an aperture in a metal mask by using a resin or the like having high viscosity than for the sealer 110 used for sealing. A sealing frame material is applied from the aperture around the semiconductor element 106 in a printing manner. Another example is the dispense method. In order to form a sealing frame, this method uses air pressure to eject a sealing frame material for a constant amount around the semiconductor element 106 so as to draw a track. These methods may be used to form the sealing frame 109 according to the embodiment.

After the sealing frame 109 is provided at the specified position on the circuit substrate 101, the sealer 110 is injected into the sealing frame 109. The sealer 110 coats and seals the semiconductor element 10, the bonding wire 107, and part of the conductive pattern 102 in the region defined by the sealing frame 109.

Then, the sealer 110 is heated at approximately 100° through 180° C. for approximately 1 through 6 hours to harden the sealer 110 in the sealing frame 109 for protecting the semiconductor element 106 and the like.

The semiconductor device manufacturing method according to the present invention configures the sealing frame 109 using a material having a high heat shrink-ability, i.e., a material capable of easy thermal expansion. Accordingly, the sealing frame 109 according to the embodiment is previously provided on the circuit substrate 101 and causes an outward stress and expands due to a heating process for hardening the sealer 110.

After this sealing process, the circuit substrate 101 mounted with the semiconductor element 106 is returned to normal temperatures (approximately 18° C. through 36° C.) and is cooled.

While the previous heating process expands the sealing frame 109, the cooling process shrinks it faster than the sealer 110 that was injected in the frame and was hardened. That is, in the sealing frame 109, a stress is applied toward the inside of the sealing frame 109 from the outside thereof.

As a result, a crack occurs at an interface between the sealing frame 109 and the sealer 110 and at an interface between the sealing frame 109 and the circuit substrate 101, removing the sealing frame 109.

This is because the sealing frame 109 is made of the material having a higher heat shrink-ability than that of the material for the sealer 110 that is injected into the sealing frame 109 and is hardened. Since the sealing frame 109 is expanded before injection of the sealer 110, it is possible to use a difference of stresses applied to the sealing frame 109 and the sealer 110.

The above-mentioned process can provide the miniaturized semiconductor device without the sealing frame 109.

The semiconductor device manufacturing method according to the embodiment uses the heating process for hardening the sealer 110 and cools the circuit substrate mounted with the semiconductor element 106. This causes a difference between stresses of the sealing frame 109 and the sealer 110 and between those of the sealing frame 109 and the circuit substrate 101. The stress difference is used to cause a crack between the sealing frame 109 and the sealer 110, removing the sealing frame to restrict the external dimension. Namely, the use of the semiconductor device manufacturing method according to the embodiment can provide the more miniaturized semiconductor device not having sealing frame 109 without adding a new process for removing the sealing frame 109.

The semiconductor device manufactured by the embodiment uses the sealer 110 comprising one material to cover and protect the conductive pattern 102, the semiconductor element 106, and the bonding wire 107. Particularly, the sealer 110 protects a range of the bonding wire 107 easily subject to an effect of external force, i.e., from a portion connected to the conductive pattern 102 on the circuit substrate 101 to a portion connected to the electrode of the semiconductor element 106.

For the purpose of further miniaturization, the conventional semiconductor device protects the conductive pattern, the semiconductor element, and the bonding wire with the sealing frame and the sealer formed of different component materials. In this case, the sealing frame and the sealer generates a difference between their stresses, and this difference may break or remove the bonding wire 107. By using the above-mentioned configuration, the semiconductor device according to the embodiment can protect the bonding wire 107 against its breakage or removal that may be caused in the conventional semiconductor device. As a result, it becomes possible to provide highly reliable semiconductor devices by promoting miniaturization.

In addition, the semiconductor device manufacturing method according to the embodiment mounts the sealing frame 109 comprising Cu or the like on the circuit substrate 101. While the conventional method needs to prepare the sealing frame 109 for respective semiconductor devices, the embodiment makes it possible to repeatedly use the sealing frame 109 for a plurality of semiconductor devices. As a result, it becomes possible to manufacture semiconductor devices at a lower cost.

Namely, the semiconductor device manufacturing method according to the present invention can decrease costs, shorten the manufacturing time, and provide miniaturized COB-mounted semiconductor devices.

The semiconductor device manufacturing method according to the embodiment has explained the example of expanding the sealing frame 109 by means of the heating process for hardening the sealer 110. Before the sealer 110 is hardened, there is no limitation as to when the sealing frame 109 should be heated to be expanded.

The embodiment heats the circuit substrate 101, stops heating it, returns it to normal temperatures, and then removes the sealing frame 109. It may be also preferable to harden the sealer 110 at normal temperatures, then cool the circuit substrate 101 below normal temperatures, and cause a stress on the sealing frame 109 to remove it.

While the embodiment has explained the example of using one member for the sealing frame 109 to prevent the sealer 110 from flowing out, the configuration of the sealing frame 109 is not limited thereto.

In addition to the sealing frame 109 according to the embodiment, the sealing frame 109 can comprise a plurality of members. As shown in FIG. 2, it is possible to use a first member 201 and a second member 202. The first member 201 contacts with the circuit substrate 101 and the sealer 110. The second member 202 is arranged apart from the circuit substrate 101 and the sealer 110 and in contact with the first member 201.

The second member 202 is provided on the outer wall side. The first member 201 is provided on the inner wall side. The second member 202 is preferably made of a material having the heat shrink-ability smaller than that of the first member 201.

There are some considerations as to examples of materials used for the members. When Al is used for the first member provided on the inner wall side, it is desirable to use Cu and the like as a material for the second member in consideration of a stress applied to an interface between the first member 201 and the second member 202

As mentioned above, the sealing frame 109 can comprise not only a single member, but also a plurality of members having different heat shrinkabilities. The use of the multi-structured sealing frame 109 can control the direction of a stress generated in the sealing frame 109 when the circuit substrate 101 is cooled. Namely, the stress direction is controlled from the first member having a high heat shrinkability to the second member having a low heat shrinkability, thus removing the sealing frame from the circuit substrate 101 and the sealer 110.

As a result, the sealing frame 109 can be reliably removed at the bonding interface between the circuit substrate 101 and the sealer 110.

The following describes a semiconductor module manufacturing method according to the present invention with reference to FIGS. 3(a) through 3(d).

Figure 3A:
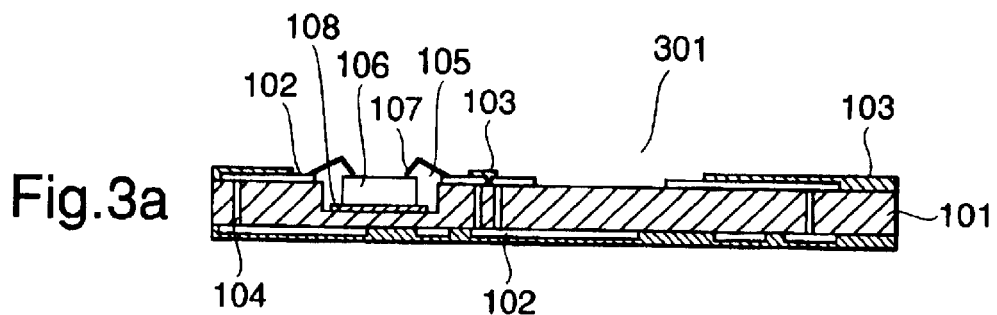
FIGS. 3a–3d are sectional views showing processes in a semiconductor module manufacturing method according to the present invention.
Figure 3B:
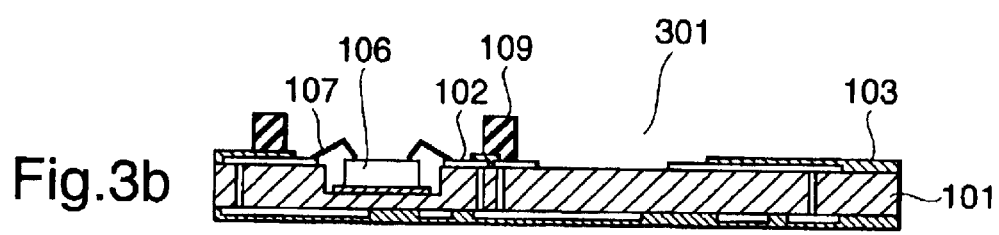

FIGS. 3(a) and 3(b) are sectional views showing processes in the semiconductor module manufacturing method according to the present invention. The same reference symbols as those used in the first embodiment correspond to the same or equivalent parts.

As shown in FIG. 3, the circuit substrate 101 is prepared like the above-mentioned semiconductor device manufacturing method. On the surface of the circuit substrate 101, there are formed the conductive pattern 102, the solder resist 103, and the concave portion 105. The semiconductor element 106 is mounted on a specified position in the concave portion 105. Thereafter, the wire bonding method or the like is used to electrically connect an electrode of the semiconductor element 105 with the conductive pattern 102 on the circuit substrate 101.

When a semiconductor module is manufactured, the solder resist 103 is removed to provide a region 301 adjacent to a specified area for mounting a COB semiconductor device on the circuit substrate 102. The region 301 is used to mount a surface-mounted semiconductor device 302 such as QFP and SOP having a lead frame. The conductive pattern 102 on the circuit substrate 101 is exposed from the solder resist 103 and is arranged in the region 301. The conductive pattern 102 is electrically connected to the semiconductor device 302.

In the embodiment, it is desirable to provide a distance of approximately 0.2 mm or more between two adjacent regions where the semiconductor devices 106 and 302 are to be mounted on the circuit substrate 101.

The distance is determined in consideration of misalignment of the mask when the solder resist is removed for forming the regions or misalignment of the position for a surface-mounted semiconductor device. The distance is appropriately determined in accordance with semiconductor devices constituting the semiconductor module.

Then, as shown in FIG. 3(b), the sealing frame 109 is arranged on the circuit substrate 101 around the semiconductor element 106, the bonding wire 107, and part of the conductive pattern 102 mounted at specified positions on the circuit substrate 101. The sealing frame 109 is provided to prevent an outflow of the sealer 110.

Here, like the above-mentioned semiconductor device manufacturing method, the sealing frame 109 mounted on the circuit substrate 101 is made of the material having a higher heat shrink-ability than the sealer 110 that is injected into the sealing frame 109 in the later process. Like the above-mentioned case, the sealing frame 109 has the width of approximately 0.3 mm and has the height of 1 mm.

The above-mentioned mounting method, printing method, dispense method, etc. can be used to form the sealing frame 109 for the semiconductor module manufacturing method according to the present invention. As shown in FIG. 3(b), however, there is a short distance between regions for mounting devices. Further, a step may be generated due to a solder resist at a position where the sealing frame 109 is provided. In these cases, it is desirable to use the printing method, the dispense method, and the like that can effectively cover steps when forming the sealing frame 109.

Figure 3C:
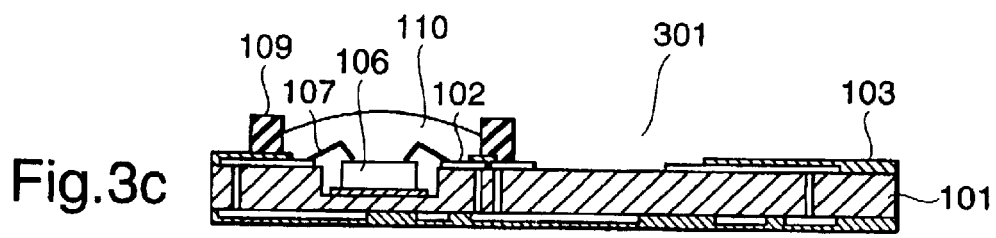

After the sealing frame 109 is provided in this manner, the sealer 110 is injected into the sealing frame 109 as shown in FIG. 3(c). The sealer 110 coats the semiconductor element 106, the bonding wire 107, and part of the conductive pattern 102 in the region surrounded by the sealing frame 109.

Then, the sealer 110 is heated at approximately 100° C. through 180° C. for approximately 1 through 6 hours to harden the sealer 110. This protects the semiconductor element 106 and the like.

Also in this semiconductor module manufacturing method, the sealing frame 109 having a high heat shrinkability expands during a heating process to harden the sealer 110. Accordingly, a stress occurs in the sealing frame 109 when the circuit substrate 101 is cooled. As a result, the sealing frame 109 is released from the sealer 110, and then is removed from the circuit substrate 101.

In this manner, one semiconductor device constituting the semiconductor module is mounted on the circuit substrate 101.

Figure 3D:
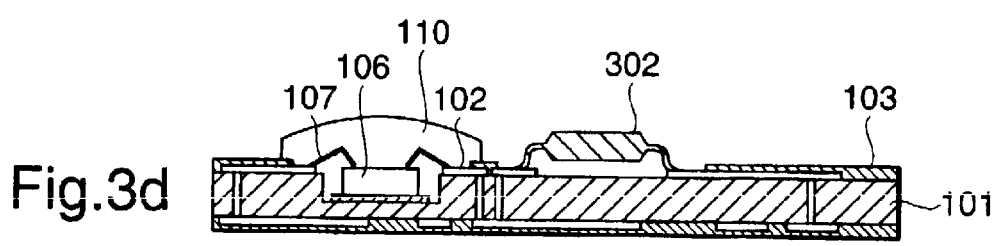

After the COB semiconductor device is mounted, as shown in FIG. 3(d), the semiconductor module manufacturing method further mounts the surface-mounted semiconductor device of the lead frame type such as QFP and SOP in another adjacent region for mounting a semiconductor device to complete the intended semiconductor module.

The sealing frame 109 is used to seal the COB semiconductor device first mounted on the circuit substrate 101 and may partially cover the adjacent region 301 for mounting a semiconductor device. In such case, the semiconductor module manufacturing method according to the present invention can remove the sealing frame 109 made of the material having a higher heat shrink-ability than the sealer 110 from the circuit substrate 101 during the heating and cooling processes to harden the sealer 110. It becomes unnecessary to consider a width for the sealing frame 109. As a result, it is possible to minimize a distance between the COB semiconductor device constituting the semiconductor module and the other semiconductor device. That is, the overall area for the semiconductor module can be reduced.

Like the above-mentioned semiconductor device manufacturing method, the semiconductor module manufacturing method according to the present invention can save costs, shorten the manufacturing time, and provide the miniaturized semiconductor module including a COB semiconductor device.

As mentioned above, the semiconductor device manufacturing method according to the present invention uses the heating process to harden the sealer 110 and removes the sealing frame 109 by using a difference between stresses applied to the sealing frame 109 and the sealer 110 adjacent to each other after cooling the circuit substrate 101 mounted with the semiconductor element 106. Consequently, it becomes possible to provide more miniaturized semiconductor devices and semiconductor modules having no sealing frame 109 without needing to add a new process for removing the sealing frame 109.

What is claimed is:

1. A semiconductor device manufacturing method, comprising:

arranging a dam made of a highly heat-shrinkable material on a circuit substrate, the circuit substrate having at least one surface provided with a semiconductor element, a conductive pattern, and a conductor having one end connected to the semiconductor element and another end connected to the conductive pattern, wherein the dam defines a region including the semiconductor element, the conductor, and a part of the conductive pattern connected to the another end of the conductor;

injecting a sealer into the region defined by the dam and using the sealer to seal the semiconductor element, the conductor, and the part of the conductive pattern connected to the another end of the conductor, the sealer having a heat shrinkability that is lower than a heat shrinkability of the dam; and cooling the dam to remove the dam.

2. The semiconductor device manufacturing method according to claim 1, wherein said cooling causes a difference between stresses to be applied to the sealer and the dam to remove the dam.

3. The semiconductor device manufacturing method according to claim 1, wherein said injecting includes heating the circuit substrate and the dam to harden the sealer and seal the part of the conductive pattern, the conductor, and the semiconductor element with the sealer.

4. The semiconductor device manufacturing method according to claim 3, wherein the circuit substrate and the dam are heated to approximately 100° C. or higher.

5. The semiconductor device manufacturing method according to claim 3, wherein said cooling the dam includes cooling to normal temperatures.

6. The semiconductor device manufacturing method according to claim 1, wherein the dam is made of metal.

7. The semiconductor device manufacturing method according to claim 1, wherein a concave portion is formed on the surface of the circuit substrate and the semiconductor element is arranged at a bottom of the concave portion.

8. The semiconductor device manufacturing method according to claim 1, wherein the dam comprises a first member in contact with the circuit substrate and the sealer, and a second member in contact with the first member, the first member being made of a material more heat-shrinkable than the second member.

9. The semiconductor device manufacturing method according to claim 1, wherein the sealer is a fluid resin and is hardened during said cooling.

10. The semiconductor device manufacturing method according to claim 1, wherein the dam is approximately 1.0 mm high from the surface of the circuit substrate.

11. The semiconductor device manufacturing method according to claim 1, wherein the dam is arranged so as to surround the semiconductor element.

12. A semiconductor device manufacturing method, comprising:

arranging a dam made of a highly heat-shrinkable material on a first circuit substrate, the first circuit substrate having at least one first surface provided with a first semiconductor element, a first conductive pattern, and a first conductor having one end connected to the first semiconductor element and another end connected to the first conductive pattern, wherein the dam defines a region including the first semiconductor element, the first conductor, and a part of the first conductive pattern connected to the another end of the first conductor;

injecting a first sealer into the region defined by the dam and using the first sealer to seal the first semiconductor element, the first conductor, and the part of the first conductive pattern, the first sealer having a heat shrinkability that is lower than a heat shrinkability of the dam;

cooling the dam to remove the dam;

arranging the removed dam on a second circuit substrate, the second circuit substrate having at least one second surface provided with a second semiconductor element, a second conductive pattern, and a second conductor having one end connected to the second semiconductor element and another end connected to the second conductive pattern; and injecting a second sealer into a region defined by the dam arranged on the second circuit substrate, and using the second sealer to seal the second semiconductor element, the second conductor, and a part of the second conductive pattern connected to the another end the second conductor.

13. The semiconductor device manufacturing method according to claim 12, wherein said cooling causes a difference between stresses to be applied to the first sealer and the dam.

14. The semiconductor device manufacturing method according to claim 12, wherein said injecting a first sealer includes heating the first circuit substrate and the dam, and said injecting a second sealer includes heating the second circuit substrate and the dam, to respectively harden the first and second sealers, and respectively seal the part of the first or second conductive pattern, the first or second conductor, and the first or second semiconductor element with the first or second sealer.

15. The semiconductor device manufacturing method according to claim 14, wherein the first or second circuit substrate and the dam are heated to approximately 100° C. or higher.

16. The semiconductor device manufacturing method according to claim 14, wherein said cooling the dam includes cooling to normal temperatures.

17. The semiconductor device manufacturing method according to claim 12, wherein the dam is made of metal.

18. The semiconductor device manufacturing method according to claim 12, wherein a concave portion is formed on the surface of the first or second circuit substrate and the first or second semiconductor element is arranged at a bottom of the concave portion.

19. The semiconductor device manufacturing method according to claim 12, wherein the dam comprises a first member in contact with the first or second circuit substrate and the sealer, and a second member in contact with the first member, the first member being made of a material more heat-shrinkable than the second member.

20. The semiconductor device manufacturing method according to claim 12, wherein the first and second sealers are a fluid resin and are hardened by cooling.

21. The semiconductor device manufacturing method according to claim 12, wherein the dam is approximately 1.0 mm high from the surface of the first or second circuit substrate.

22. The semiconductor device manufacturing method according to claim 12, wherein the dam is arranged so as to surround the first or second semiconductor element.

23. A semiconductor device manufacturing method, comprising:

arranging a dam made of a highly heat-shrinkable material on a circuit substrate, the circuit substrate having at least one surface provided with a semiconductor element, a conductive pattern, and a conductor having one end connected to the semiconductor element and another end connected to the conductive pattern, the dam surrounding a first region of the circuit substrate that includes the semiconductor element, the conductor, and a part of the conductive pattern connected to the another end of the conductor, the dam separating the first region from a second region of the circuit substrate that includes another part of the conductive pattern;

injecting a sealer into the first region defined by the dam and using the sealer to seal the semiconductor element, the conductor, and the part of the conductive pattern connected to the another end of the conductor, the sealer having a heat shrinkability that is lower than a heat shrinkability of the dam, the dam retaining the sealer within the first region, and preventing the sealer from flowing from the first region and into the second region, so that the second region remains essentially free of the sealer; and cooling the dam to remove the dam.

24. The semiconductor device manufacturing method according to claim 23, wherein during said cooling, the dam shrinks faster than the sealer.

25. The semiconductor device manufacturing method according to claim 23, wherein said cooling causes a crack to be formed at an interface between the dam and the sealer.

26. The semiconductor device manufacturing method according to claim 23, wherein an inner wall of the dam is positioned less than about 1 mm away from where the another end of the conductor is connected to the conductive pattern.

27. The semiconductor device manufacturing method according to claim 23, wherein the dam is comprised of at least one of copper, aluminum, silver, high-viscosity epoxy resin and polyimide resin, and the sealer is comprised of an epoxy resin.

* * * * *